(12) United States Patent
Shen et al.

(10) Patent No.: US 8,602,838 B2
(45) Date of Patent: Dec. 10, 2013

(54) CHEMICAL MECHANICAL POLISHING METHOD AND SYSTEM

(75) Inventors: Meng-Yi Shen, Yunlin County (TW); Liang-Yu Hu, Hsinchu County (TW); Tsung-Hsuan Ho, Hsinchu County (TW); Sheng-I Tseng, Hsinchu (TW)

(73) Assignee: Mcronix International Co., Ltd., Hsin-chu (TW)

( * ) Notice: Subject to any disclaimer, the term of this patent is extended or adjusted under 35 U.S.C. 154(b) by 431 days.

(21) Appl. No.: 12/869,155

(22) Filed: Aug. 26, 2010

(65) Prior Publication Data

US 2012/0052604 A1    Mar. 1, 2012

(51) Int. Cl.
*H01L 21/66*    (2006.01)
*B24B 51/00*    (2006.01)

(52) U.S. Cl.
USPC .............................. 451/5; 257/E21.53; 438/7

(58) Field of Classification Search
USPC ........... 700/121, 164; 451/5, 6, 8, 41; 438/14, 438/16, 692, 5, 7; 257/E21.53
See application file for complete search history.

(56) References Cited

U.S. PATENT DOCUMENTS

| | | | |
|---|---|---|---|
| 5,791,969 A * | 8/1998 | Lund ................................. | 451/5 |
| 5,948,203 A * | 9/1999 | Wang ............................ | 451/287 |
| 6,108,091 A * | 8/2000 | Pecen et al. ....................... | 451/6 |
| 6,319,093 B1 * | 11/2001 | Lebel et al. ....................... | 451/6 |
| 6,368,915 B1 * | 4/2002 | Montree et al. ............... | 438/257 |
| 6,594,542 B1 * | 7/2003 | Williams ....................... | 700/164 |
| 6,621,584 B2 * | 9/2003 | Pecen et al. ....................... | 451/6 |
| 6,623,333 B1 * | 9/2003 | Patel et al. ...................... | 451/41 |
| 6,787,806 B1 * | 9/2004 | Yamazaki et al. ............. | 257/64 |
| 7,018,275 B2 * | 3/2006 | Zuniga et al. .................. | 451/41 |
| 7,234,998 B2 * | 6/2007 | Aoyagi et al. ..................... | 451/5 |
| 7,372,073 B2 * | 5/2008 | Yamazaki et al. ............. | 257/49 |
| 8,025,759 B2 * | 9/2011 | Sasaki et al. ............. | 156/345.13 |
| 8,106,512 B2 * | 1/2012 | Lee et al. ....................... | 257/751 |
| 2002/0197745 A1 * | 12/2002 | Shanmugasundram et al. .. | 438/5 |
| 2003/0235989 A1 * | 12/2003 | Jayashankar ................. | 438/691 |
| 2004/0111175 A1 * | 6/2004 | Kim et al. ..................... | 700/121 |
| 2004/0206958 A1 * | 10/2004 | Yamazaki et al. ............. | 257/59 |
| 2004/0235301 A1 * | 11/2004 | Wada et al. ................... | 438/689 |
| 2006/0258069 A1 * | 11/2006 | Yamazaki et al. ............ | 438/166 |
| 2007/0102116 A1 * | 5/2007 | Shanmugasundram et al. ............................. | 700/121 |
| 2011/0227156 A1 * | 9/2011 | Khater et al. ................. | 257/347 |
| 2011/0230017 A1 * | 9/2011 | Khater et al. ................. | 438/151 |
| 2011/0233688 A1 * | 9/2011 | Ren et al. ...................... | 257/408 |

* cited by examiner

*Primary Examiner* — Charles Kasenge
(74) *Attorney, Agent, or Firm* — Volpe and Koenig, P.C.

(57) ABSTRACT

A chemical mechanical polishing method is provided. The chemical mechanical polishing method includes steps of providing a plurality of semiconductor elements to be polished, obtaining a respective dimension of the each semiconductor element to be polished, and polishing the each semiconductor element according to the respective dimension thereof.

19 Claims, 5 Drawing Sheets

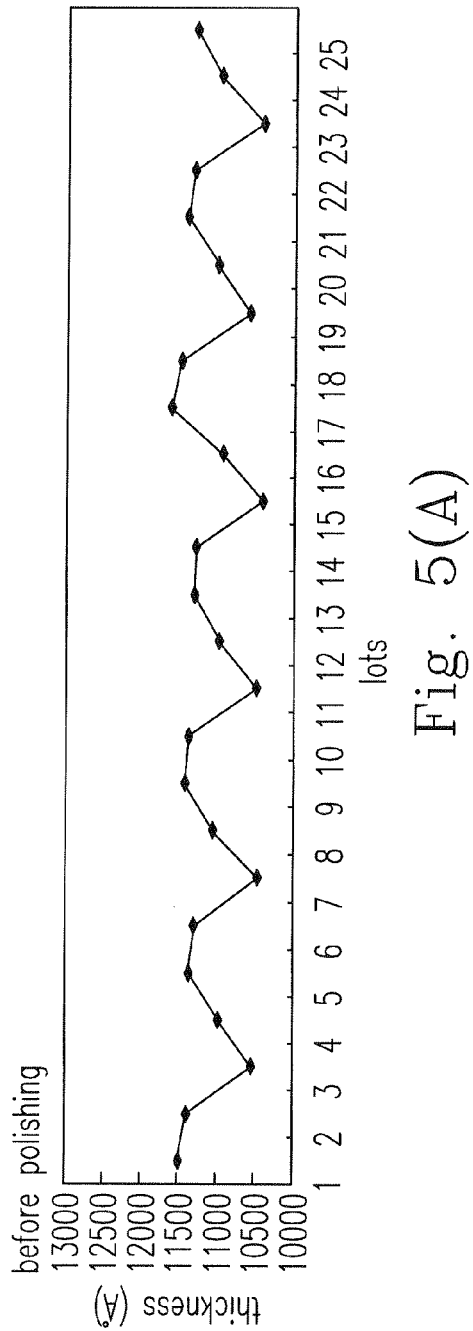
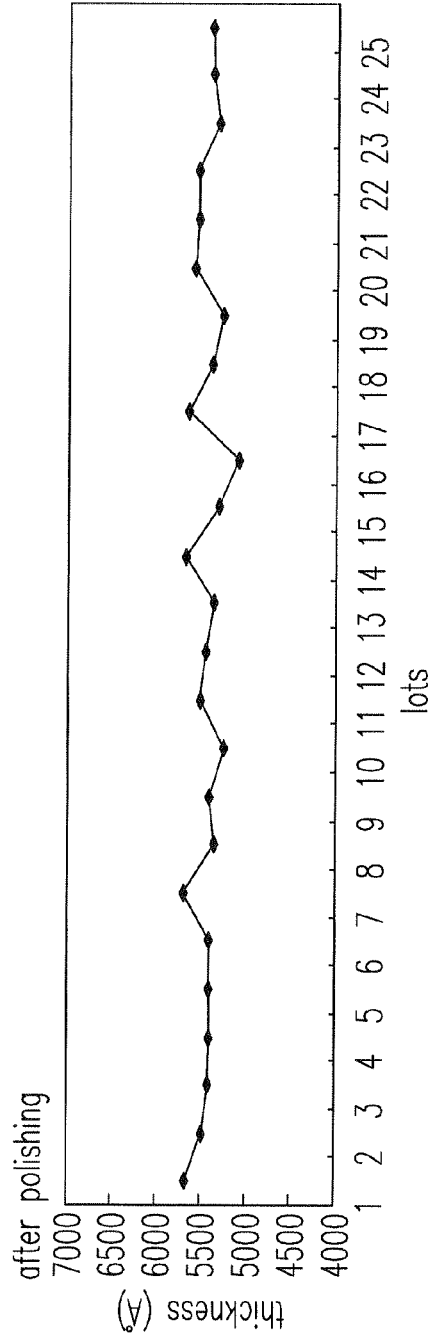
Fig. 5(A)
Fig. 5(B)

CHEMICAL MECHANICAL POLISHING METHOD AND SYSTEM

FIELD OF THE INVENTION

The present invention relates to a chemical mechanical polishing method and a system thereof, and more particularly to an advance process control of a chemical mechanical polishing process.

BACKGROUND OF THE INVENTION

In a semiconductor process, the global planarization for a semiconductor element is more and more important with the continuous decreasing dimension of the semiconductor element. Currently, the most common global planarization method for a surface of a wafer is a chemical mechanical polishing (CMP) process, by which the surface of the wafer is pressed on a polishing pad having polishing materials thereon, and the polishing pad rotates to planarize the surface of the wafer.

When a CMP process is adopted to polish a semiconductor element, the element may be over polished due to an overlong polishing time, which results in overhigh resistance of the metal lines thereon and causes the reducing of the speed of the semiconductor element, and the dielectric layers thereon may also be seriously damaged. On the other hand, if the polishing time is not long enough to completely remove the metals on the dielectric layers, a situation of under polish will be caused and the properties of the semiconductor element will be affected. Accordingly, a control of the thickness of the element to be polished in a CMP process could avoid the mentioned over polish or under polish situation, and then the yield of the products could be raised.

Please refer to FIG. 1, which is a flow chart illustrating a conventional method of controlling the thickness of the element to be polished in a CMP process. In the conventional CMP process, a feedback control is utilized to adjust the polishing time of the wafers. Firstly, two or three wafers in a first lot are sampled for measuring the thickness thereof and performing a polishing test (step 10). The best polishing time for the first lot of wafers is estimated based on the measured and tested results (step 11). The first lot of wafers is polished over the estimated best polishing time (step 12). After the step 12, the polished wafers are sampled for measuring the thickness thereof (step 13), and the measured results are fed back to the next lot of wafers for estimating the best polishing time of the next lot of wafers (step 14).

Accordingly, in the conventional CMP process, the polishing parameters such as the polishing time of a first lot of wafers are estimated by only sampling some wafers in the first lot, which results in high yield loss. Furthermore, the production cost is high when the feedback control system is adopted to estimate the polishing time of the next lot of wafers. Moreover, the thickness to be polished of each wafer cannot be precisely controlled by merely providing the same estimated polishing time for all of the wafers in one lot. Therefore, the failure rate cannot be significantly reduced in the conventional CMP process.

For overcoming the drawbacks in the prior art, a chemical mechanical polishing method and a system thereof are provided to increase the efficiency, accuracy and stability of the CMP process.

SUMMARY OF THE INVENTION

A chemical mechanical polishing method and a system thereof are provided in the present invention to precisely control the thickness to be polished of each of the elements in a CMP process without using the feedback control scheme of the prior art, and further to significantly reduce the yield loss and optimize the quality of the products.

In accordance with one aspect of the present invention, a method of chemical mechanical polishing is provided. The method comprises steps of providing a plurality of semiconductor elements, each of which has a dimension, obtaining the respective dimension of the each semiconductor element, and polishing the each semiconductor element according to the respective dimension thereof.

In accordance with another aspect of the present invention, a method of chemical mechanical polishing is provided. The method comprises steps of providing a plurality of articles, each of which has a physical parameter, obtaining all of the physical parameters of the plurality of articles, and determining a specific polishing parameter for the each article according to the physical parameter thereof.

In accordance with a further aspect of the present invention, a chemical mechanical polishing system is provided. The chemical mechanical polishing system is used to polish a plurality of articles and comprises a measuring device, a determining device and a polishing device. The measuring device obtains a physical parameter of each of the plurality of articles. The determining device is coupled to the measuring device, and determines a specific polishing parameter for the each article according to the physical parameter thereof. The polishing device is coupled to the determining device, and polishes the each article according to the specific polishing parameter thereof.

The above objects and advantages of the present invention will become more readily apparent to those ordinarily skilled in the art after reviewing the following detailed descriptions and accompanying drawings, in which:

BRIEF DESCRIPTION OF THE DRAWINGS

FIG. 5(A) is a diagram showing the respective average thickness of plural lots of wafers before being polished.

FIG. 5(B) is a diagram showing the respective average thickness of the plural lots of wafers after being polished by the chemical mechanical polishing method and system of the present invention.

DETAILED DESCRIPTION OF THE PREFERRED EMBODIMENT

The present invention will now be described more specifically with reference to the following embodiments. It is to be noted that the following descriptions of embodiments of this invention are presented herein for the purposes of illustration and description only; it is not intended to be exhaustive or to be limited to the precise form disclosed.

Figure 1:
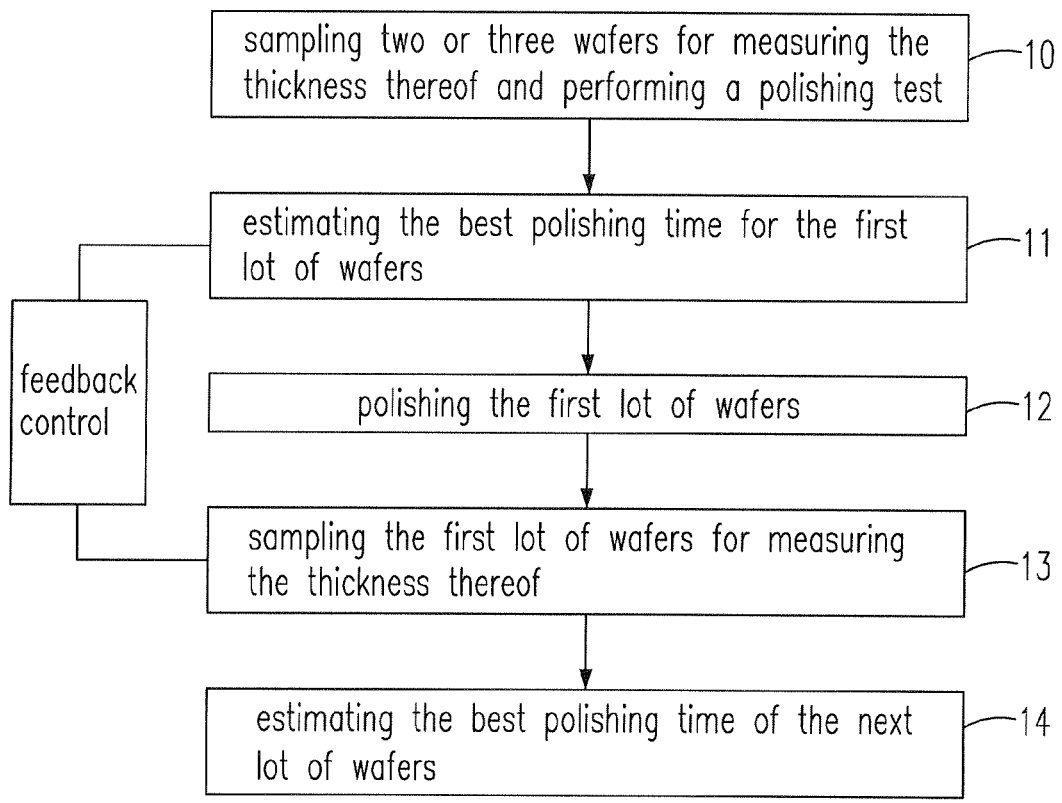
FIG. 1 is a flow chart illustrating a conventional method of controlling the thickness of the element to be polished in a CMP process.
Figure 2A:
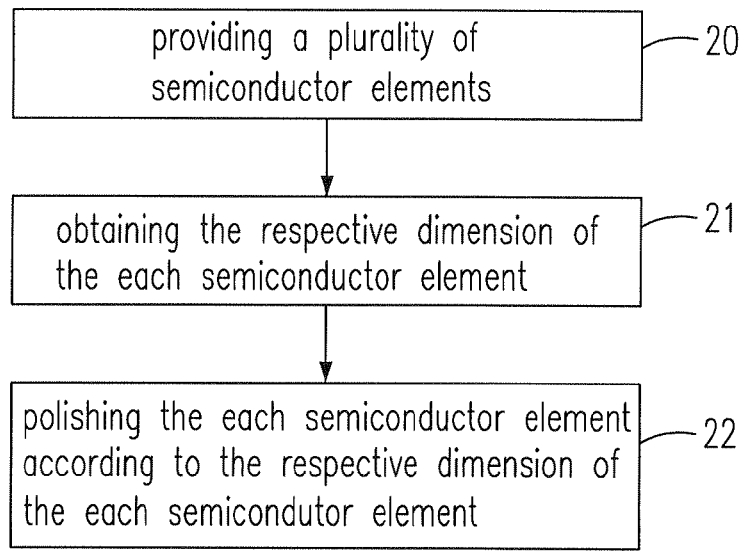
FIG. 2(A) is a flow chart illustrating a chemical mechanical polishing method according to an embodiment of the present invention.

Please refer to FIG. 2(A), which is a flow chart illustrating a chemical mechanical polishing method according to an embodiment of the present invention. The chemical mechanical polishing method comprises steps of: providing a plurality of semiconductor elements (step 20), wherein each of the plurality of semiconductor elements has a dimension; obtaining the respective dimension of the each semiconductor element (step 21) by using a measuring machine or other measuring means for the elements in a common CMP process; and polishing the each semiconductor element according to the respective dimension of the each semiconductor element (step 22).

According to the mentioned embodiment, the plurality of semiconductor elements are a plurality of wafers. Practically, the chemical mechanical polishing method provided in the present invention may also be applied to other articles to be polished in a CMP process.

According to the mentioned embodiment, for example, the step 21 may include a step of measuring all the respective dimensions of the semiconductor elements one by one for obtaining the respective dimension of the each semiconductor element. The dimension may include a thickness of the semiconductor element and thickness of various material layers in the semiconductor element, and the unit of the thickness may be angstrom (Å).

Figure 2B:
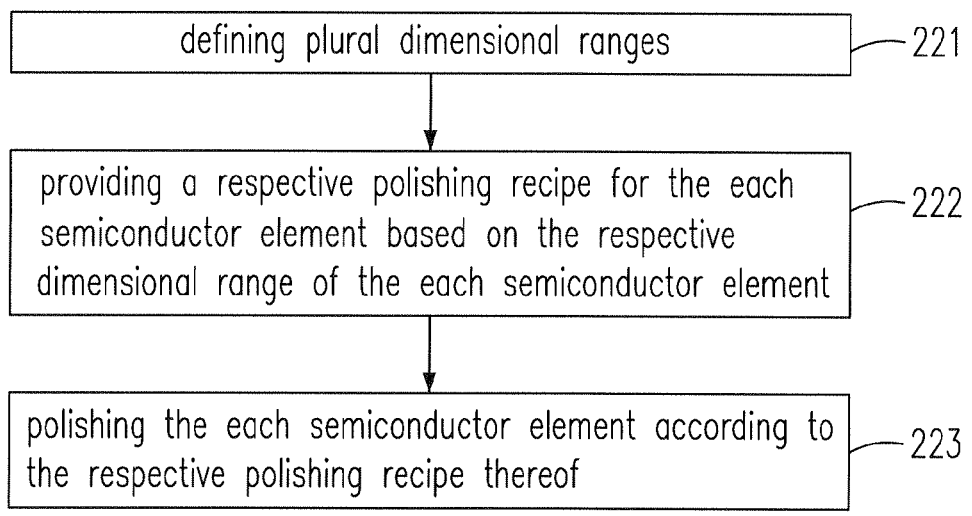
FIG. 2(B) is a flow chart illustrating an embodiment of the step 22 in FIG. 2(A).

Please refer to FIG. 2(B), which is a flow chart illustrating an embodiment of the step 22 in FIG. 2(A). The step 22 may include sub-steps of: defining plural dimensional ranges (step 221), wherein each semiconductor element has a respective dimensional range among the plural dimensional ranges, and each of the dimensional ranges has a corresponding polishing recipe; providing a respective polishing recipe for the each semiconductor element based on the respective dimensional range of the each semiconductor element and the corresponding polishing recipe of the each dimensional range (step 222); and polishing the each semiconductor element according to the respective polishing recipe thereof (step 223).

According to the mentioned embodiment, a corresponding table for the defined dimensional ranges and the corresponding polishing recipes are provided as Table 1. Practically, the skilled person may design or adjust the contents of the corresponding table based on the properties of various articles to be polished or various parameters of the polishing machine

TABLE 1

| dimensional ranges (Å) | Number of corresponding polishing recipe |
|---|---|
| 1~10500 | X |
| 10501~10600 | 001 |
| 10601~10700 | 002 |
| 10701~10800 | 003 |
| 10801~10900 | 004 |
| . | . |
| . | . |
| . | . |
| 12101~12200 | 017 |
| 12201~12300 | 018 |
| 12301~12400 | 019 |
| 12401~12500 | 020 |
| 12501~99999 | X |

In Table 1, "X" represents that the system will not provide a corresponding polishing recipe for an element when the measured thickness of the element is out of the defined dimensional ranges.

According to the mentioned embodiment, the respective polishing recipe includes a polishing time for the each semiconductor element, and may further include other polishing parameters, such as temperature, pressure and polishing materials. Furthermore, the plural dimensional ranges include at least twenty ranges, and each dimensional range has a range span of 100 Å. It is to be noted that the amount of the dimensional ranges and the range span may be optionally designed depending on the actual need of the polishing process.

Figure 3:
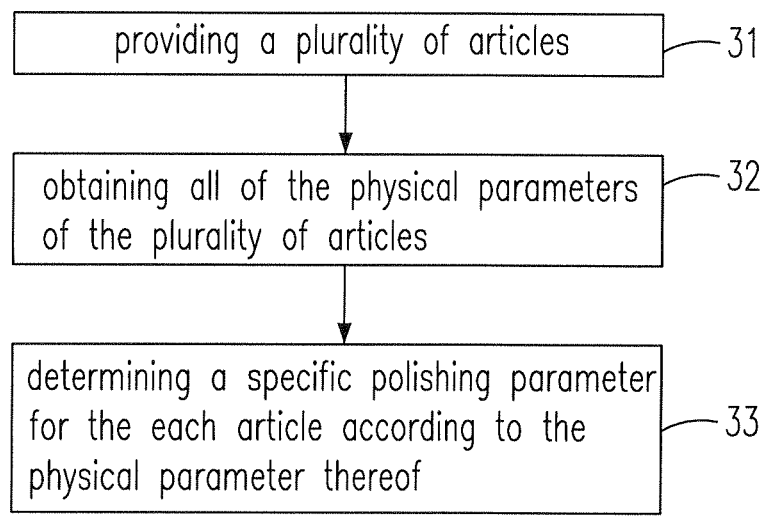
FIG. 3 is a flow chart illustrating a chemical mechanical polishing method according to another embodiment of the present invention.

Please refer to FIG. 3, which is a flow chart illustrating a chemical mechanical polishing method according to another embodiment of the present invention. The chemical mechanical polishing method comprises steps of: providing a plurality of articles to be polished (step 31), each of which has a physical parameter; obtaining all of the physical parameters of the plurality of articles (step 32); and determining a specific polishing parameter for the each article according to the physical parameter thereof (step 33). The step 32 may include a step of measuring respective dimensions of the articles one by one to obtain the physical parameter of the each article, wherein the physical parameter at least includes a thickness of the each article, and the specific polishing parameter at least includes a polishing time for the each article.

According to the mentioned embodiment, the article may be a semiconductor element, such as a wafer.

Figure 4:
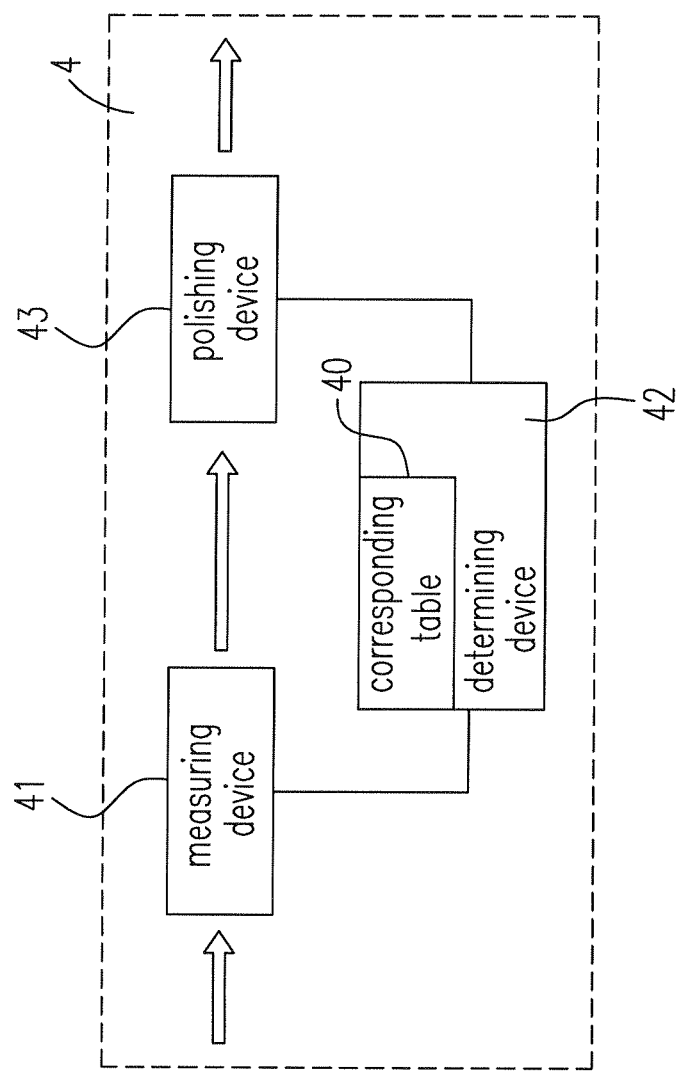
FIG. 4 is a diagram showing the chemical mechanical polishing system in the present invention.

Please refer to FIG. 4, which is a diagram showing the chemical mechanical polishing system according to an embodiment of the present invention. The chemical mechanical polishing system 4 comprises: a measuring device 41 obtaining a physical parameter of each of a plurality of articles; a determining device 42 coupled to the measuring device 41, and determining a specific polishing parameter for the each article according to the physical parameter thereof; and a polishing device 43 coupled to the determining device 42, and polishing the each article according to the specific polishing parameter thereof. In FIG. 4, the arrows illustrate the direction of the articles to be transported in the chemical mechanical polishing system 4.

According to the mentioned embodiment, the determining device 42 may be a polishing recipe generator, in which a corresponding table 40 such as Table 1 is set inside or input by an operator of the system, for generating the corresponding polishing recipe for the each article based on the physical parameter thereof and the corresponding table 40 when receiving the physical parameter of the each article from the measuring device 41. The corresponding polishing recipe generated by the determining device 42 includes the specific polishing parameter of the each article.

According to the mentioned embodiment, the article may be a semiconductor element, such as a wafer. The physical parameter at least includes a thickness of the each article, and the specific polishing parameter at least includes a polishing time for the each article.

Please refer to FIGS. 5(A) and 5(B). FIG. 5(A) is a diagram showing the respective average thickness of 25 lots of wafers before being polished, and FIG. 5(B) is a diagram showing the respective average thickness of the 25 lots of wafers after being polished by the chemical mechanical polishing method and system of the present invention. Apparently, the semiconductor elements polished by the chemical mechanical polishing method and system of the present invention achieve an uniform thickness.

Based on the above, a closed-loop control system is adopted by the conventional CMP process to polish different lots of articles based on the feedback information, while an automatic open-loop control system is adopted in the present invention to provide the respective polishing recipe for each of the articles to be polished. The efficacies such as reducing the complexity of the CMP system and precisely controlling the thickness to be polished of each element are achieved by the technical schemes provided in the present invention.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method of chemical mechanical polishing, comprising steps of:
    defining plural dimensional ranges, each of which has a range span of 100 Å;
    providing a plurality of semiconductor elements, each of which has a dimension within a respective one of the plural dimensional ranges;
    obtaining the respective dimension of the each semiconductor element; and
    polishing the each semiconductor element according to the respective dimensional range thereof.

2. A method as claimed in claim 1, wherein the plurality of semiconductor elements are a plurality of wafers.

3. A method as claimed in claim 1, wherein the step of obtaining the dimension of the each semiconductor element includes a step of measuring all the respective dimensions of the semiconductor elements one by one.

4. A method as claimed in claim 1, wherein the dimension includes a thickness of the semiconductor element.

5. A method as claimed in claim 1, wherein the step of polishing the each semiconductor element includes sub-steps of:
    providing a respective polishing recipe for the each semiconductor element according to the respective dimensional range thereof; and
    polishing the each semiconductor element according to the respective polishing recipe thereof.

6. A method as claimed in claim 5, wherein the respective polishing recipe includes a polishing time for the each semiconductor element.

7. A method as claimed in claim 5, wherein
    each of the dimensional ranges has a corresponding polishing recipe, and the respective polishing recipe for the each semiconductor element is provided based on the respective dimensional range of the each semiconductor element and the corresponding polishing recipe thereof.

8. A method as claimed in claim 7, wherein the plural dimensional ranges include at least twenty ranges.

9. A method of chemical mechanical polishing, comprising steps of:
    defining plural dimensional ranges;
    providing a plurality of articles, each of which has a dimension within a dimensional range having a range span of 100 Å;
    obtaining all of the dimensions and the dimensional ranges of the plurality of articles;
    determining a specific polishing parameter for the each article according to the dimensional range thereof; and
    polishing each article according to the respective dimensional range thereof.

10. A method as claimed in claim 9, wherein the article is a semiconductor element.

11. A method as claimed in claim 9, wherein the article is a wafer.

12. A method as claimed in claim 9, further comprising a step of:
    measuring the respective dimensions of the articles one by one to obtain a physical parameter of the each article.

13. A method as claimed in claim 12, wherein the physical parameter includes a thickness of the each article.

14. A method as claimed in claim 9, wherein the specific polishing parameter includes a polishing time for the each article.

15. A chemical mechanical polishing system, comprising:
    plural dimensional ranges;
    a measuring device obtaining a dimension within a respective dimensional range of each of a plurality of articles, wherein each dimensional range has a range span of 100 Å;
    a determining device coupled to the measuring device, and determining a specific polishing parameter for the each article according to the dimensional range thereof; and
    a polishing device coupled to the determining device, and polishing the each article according to the specific polishing parameter thereof.

16. A system as claimed in claim 15, wherein the article is a semiconductor element.

17. A system as claimed in claim 15, wherein the article is a wafer.

18. A system as claimed in claim 15, wherein the dimension includes a thickness of the each article.

19. A system as claimed in claim 15, wherein the specific polishing parameter includes a polishing time for the each article.

* * * * *